US010453940B1

(12) United States Patent
Mochizuki et al.

(10) Patent No.: US 10,453,940 B1
(45) Date of Patent: Oct. 22, 2019

(54) VERTICAL FIELD EFFECT TRANSISTOR WITH STRAINED CHANNEL REGION EXTENSION

(71) Applicant: INTERNATIONAL BUSINESS MACHINES CORPORATION, Armonk, NY (US)

(72) Inventors: Shogo Mochizuki, Clifton Park, NY (US); Choonghyun Lee, Rensselaer, NY (US); Juntao Li, Cohoes, NY (US); Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/018,289

(22) Filed: Jun. 26, 2018

(51) Int. Cl.
*H01L 29/66* (2006.01)
*H01L 29/78* (2006.01)
*H01L 29/08* (2006.01)
*H01L 29/06* (2006.01)
*H01L 29/10* (2006.01)

(52) U.S. Cl.
CPC .... *H01L 29/66666* (2013.01); *H01L 29/0649* (2013.01); *H01L 29/0847* (2013.01); *H01L 29/1037* (2013.01); *H01L 29/66787* (2013.01); *H01L 29/7827* (2013.01); *H01L 29/7848* (2013.01)

(58) Field of Classification Search
CPC ............ H01L 29/1083; H01L 29/4916; H01L 29/66492; H01L 29/66537; H01L 29/66795; H01L 29/7834; H01L 29/7848; H01L 29/785; H01L 29/66666; H01L 29/0649; H01L 29/0847; H01L 29/1037; H01L 29/66787; H01L 29/7827
See application file for complete search history.

(56) References Cited

U.S. PATENT DOCUMENTS

| | | | |
|---|---|---|---|
| 6,770,534 B2 | 8/2004 | Cho et al. | |
| 7,683,428 B2 | 3/2010 | Chidambarrao et al. | |
| 8,906,768 B2 | 12/2014 | Wong et al. | |
| 9,196,712 B1 * | 11/2015 | Hasanuzzaman | H01L 21/84 |
| 9,391,200 B2 * | 7/2016 | Liu | H01L 29/7848 |
| 9,691,898 B2 | 6/2017 | Sung et al. | |
| 9,755,073 B1 | 9/2017 | Cheng et al. | |
| 9,793,401 B1 * | 10/2017 | Balakrishnan | H01L 29/7848 |
| 2006/0261406 A1 | 11/2006 | Chen | |
| 2014/0087547 A1 * | 3/2014 | Miyano | H05B 6/806 438/486 |
| 2015/0380556 A1 | 12/2015 | Ching | |
| 2016/0293761 A1 | 10/2016 | Liu et al. | |
| 2018/0158841 A1 * | 6/2018 | Glass | H01L 21/845 |
| 2019/0088767 A1 * | 3/2019 | Xie | H01L 29/66545 |

* cited by examiner

*Primary Examiner* — Mohammed Shamsuzzaman
(74) *Attorney, Agent, or Firm* — Cantor Colburn LLP; Vazken Alexanian

(57) ABSTRACT

According to one or more embodiments of the present invention, a method for forming a fin structure for a semiconductor device includes forming a fin. The method further includes recessing a first portion of the fin to form a recess in the fin. The method further includes forming a channel region in the first portion of the fin. The method further includes forming an extension region on a second portion of the fin, and wherein defects are collected within the extension regions from the channel region in the first portion of the fin.

14 Claims, 5 Drawing Sheets

VERTICAL FIELD EFFECT TRANSISTOR WITH STRAINED CHANNEL REGION EXTENSION

BACKGROUND

The present invention generally relates to fabrication methods and resulting structures for semiconductor devices. More specifically, the present invention relates to fabrication methods and resulting structures for vertical field effect transistors having a strained channel region that includes an extension region configured and arranged to address defects associated with the channel region.

The metal oxide semiconductor field effect transistor (MOSFET) is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

A type of MOSFET is a non-planar FET known generally as a vertical field effect transistor (VFET). VFETs employ semiconductor fins and side-gates that can be contacted outside the active region, resulting in increased device density and some increased performance over lateral devices. In VFETs, the source to drain current flows in a direction that is perpendicular to a major surface of the substrate. For example, in a known VFET configuration, a major substrate surface is horizontal, and a vertical fin extends upward from the substrate surface. The fin forms the channel region of the transistor. A source region and a drain region are situated in electrical contact with the top and bottom ends of the channel region, while a gate is disposed on one or more of the fin sidewalls. The introduction of strain into a VFET device would result in improved transistor performance.

SUMMARY

According to one or more embodiments of the present invention, a method for forming a fin structure for a semiconductor device includes forming a fin. The method further includes recessing a first portion of the fin to form a recess in the fin. The method further includes forming a channel region in the first portion of the fin. The method further includes forming an extension region on a second portion of the fin, and wherein defects are collected within the extension regions from the channel region in the first portion of the fin.

According to one or more embodiments of the present invention, a method for forming a semiconductor device includes, forming a first source or drain (S/D) on a semiconductor substrate. The method further includes forming a first spacer on the first S/D. The method further includes forming a fin on a portion of the first spacer. The method further includes recessing a first portion of the fin to form a recess in the fin. The method further includes forming a channel region in the first portion of the fin. The method further includes forming a first extension region on a second portion of the fin and wherein defects are collected within the extension regions from the channel region in the first portion of the fin.

According to one or more embodiments of the present invention, a semiconductor fin structure includes a first recess arranged in a first portion of the fin. The fin structure also includes a first extension region arranged on a second portion of the fin.

BRIEF DESCRIPTION OF THE DRAWINGS

FIGS. 2-10 illustrate an exemplary method for fabricating a vertical FET device according to one more embodiments of the present invention, in which:

FIG. 2 depicts a cross-sectional view of a VFET structure up to formation of a top source or drain region according to one or more embodiments of the present invention;

FIG. 3 depicts the cross-sectional view of the VFET structure after formation of a doped S/D layer on the VFET structure of FIG. 2, wherein a multifaceted doped single crystalline semiconductor material is formed on a channel region surface according to one or more embodiments of the present invention;

FIG. 4 depicts the cross-sectional view of the VFET structure of FIG. 3 subsequent to forming an oxide fill on the multifaceted doped single crystalline semiconductor material according to one or more embodiments of the present invention;

FIG. 5 depicts the cross-sectional view of the VFET structure of FIG. 4 subsequent to dummy gate removal according to one or more embodiments of the present invention;

FIG. 6 depicts the cross-sectional view of the VFET structure of FIG. 5 subsequent to a first etching process to form one or more recesses in a fin according to one or more embodiments of the present invention;

FIG. 7 depicts the cross-sectional view of the VFET structure of FIG. 6 subsequent to a second etching process to form one or more recesses in a fin according to one or more embodiments of the present invention;

FIG. 8 depicts the cross-sectional view of the VFET structure of FIG. 7 subsequent to an epitaxial growth process on exposed portions of the fins according to one or more embodiments of the present invention;

FIG. 9 depicts the cross-sectional view of the VFET structure of FIG. 8 subsequent to formation of one or more extension regions on the fin according to one or more embodiments of the present invention; and FIG. 10 depicts the cross-sectional view of the VFET structure of FIG. 9 subsequent to a replacement high-k metal gate process according to one or more embodiments of the present invention.

Figure 1:
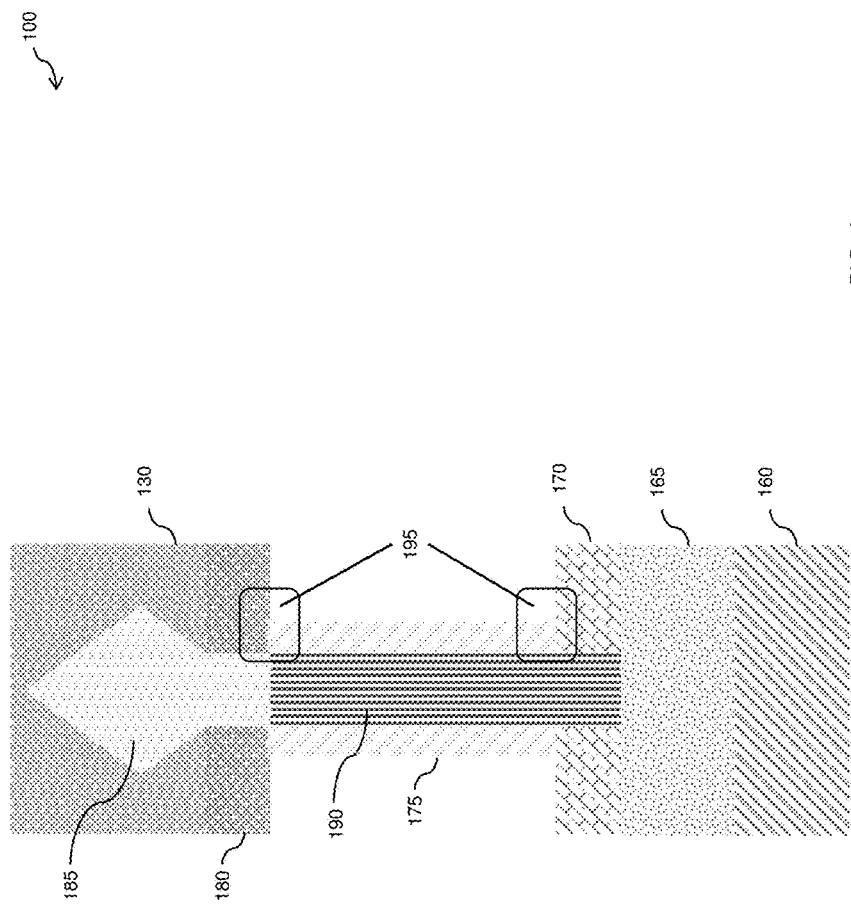
FIG. 1 illustrates a cutaway view of a known VFET structure.

The diagrams depicted herein are illustrative. There can be many variations to the diagram or the operations described therein without departing from the spirit of embodiments of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of one or more embodiments of the present invention are unique.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, and atomic layer deposition (ALD) among others.

Removal/etching is any process that removes material from the wafer. Examples include etch processes (either wet or dry), and chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

Turning now to an overview of technologies that are more specifically relevant to aspects of the invention, VFET devices provide opportunities to increase device density on a wafer. VFET devices have a source or a drain region (S/D) arranged on a substrate. The channel region is arranged vertically above the substrate such that the gate stack wraps around the channel region.

FIG. 1 illustrates a cutaway view of a known VFET structure 100 after an initial set of fabrication operations. At the fabrication stage shown in FIG. 1, the VFET structure 100 includes a Si substrate 160, a bottom S/D region 165, bottom dielectric spacers 170, a Si fin 190, a SiGe layer 175, top dielectric spacers 180, a top S/D region 185, and an interlayer dielectric (ILD) 130, configured and arranged as shown. For ease of illustration, the VFET structure 100 is depicted without a gate and a gate dielectric. The SiGe layer 175 has been epitaxially grown on a sidewall of the Si fin 190 in order to form a strained channel that includes the Si fin 190 and the SiGe layer 175.

Epitaxially growing the SiGe layer 175 from the Si fin 190 and along the dielectric spacers 170, 180 can result in crystal defects in the SiGe layer 175, which are shown by the areas 195. The crystal defects in areas 195 can also result from having two growth fronts, e.g., one from the surfaces of the dielectric spacers 170, 180 and one from the side-wall surface of the Si fin 190. Crystal defects that are proximate to the strained channel region formed from the Si fin 190 and the SiGe layer 175 can have a negative impact on performance and reliability of the final VFET. The defects in locations 195 can occur at the interface of the bottom spacer 170, top spacer 180 and the SiGe layer 175 of the channel region of the VFET structure 100 intersect. Therefore, it is desired to improve the performance of VFET structures by providing fabrication methods and resulting semiconductor devices that reduce or substantially eliminate crystal defects in epitaxially grown channel materials.

Turning now to an overview of the aspects of the invention, one or more embodiments of the invention address the above-described shortcomings of the prior art by employing strain inducing material in an extension region of a fin, which can be created using dopants from epitaxially grown S/D structures, to reduce defects at the interface of a S/D region, dielectric film (spacer) and the channel region of the device. In one or more embodiments of the invention, recesses are formed in a fin and an extension region that has been formed by dopants driven-in from a S/D, which can be used to reduce or eliminate (i.e., substantially free of) defects occurring at the interface of the spacer and the channel region of the semiconductor device. For example, in some embodiments of the invention, the methods and structures provided herein can move the site of potential defect formation to an extension region and away from the channel region of the device. The above-described aspects of the invention address the shortcomings of the prior art by moving defects to a portion of a semiconductor device having a decreased impact on performance and reliability instead of having the defects reside in a channel region of the semiconductor device.

FIGS. 2-10 illustrate an exemplary method for fabricating a VFET device.

Figure 2:
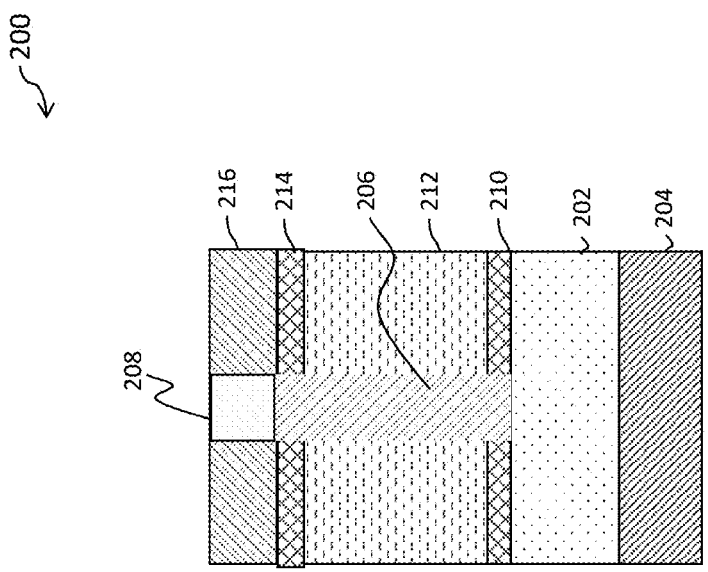

FIG. 2 illustrates a cross-sectional view representative of a VFET structure 200 up to formation of a top source or drain module (hereinafter referred to as "source/drain"). It should be apparent that one or more embodiments of the present invention are not limited to this particular structure nor is it intended to be limited to any particular method for forming the VFET up to formation of the top source/drain module. One of ordinary skill in the art will recognize that the VFET structure immediately prior to the top source/drain module can include a planar surface, or alternatively, can include topography.

The VFET structure 200 up to formation of a top source/drain module generally includes the following components as shown in FIG. 2. First, the structure 200 includes a bottom epitaxy region 202 formed on a substrate 204, wherein the bottom epitaxy region 202 is doped to define a bottom S/D region. The doping of the bottom epitaxy region 202 can be configured as the bottom S/D formed in the substrate 204 by a variety of methods, such as, for example, diffusion and/or ion implantation, in-situ doped epitaxy, or any other suitable doping techniques.

The substrate 204 can be any suitable substrate material, such as, for example, any semiconductor material including, but not limited to, Si, Ge, SiGe, SiC, SiGeC, II/IV, and III/V compound semiconductors such as, for example, InAs, GaAs, and InP. Multilayers of these semiconductor materials can also be used as substrate 204. In one or more embodiments and when substrate 204 is a remaining semiconductor material portion of a bulk semiconductor substrate, the substrate 204 can be of a single crystalline semiconductor material, such as, for example, single crystalline silicon. In some embodiments, the crystal orientation of the remaining semiconductor portion of the bulk semiconductor substrate can be {100}, {110}, {111} or any other of the well-known crystallographic orientations. As will be described in greater detail below, each semiconductor fin can include the same semiconductor material, or a different semiconductor material, from substrate 204.

In other embodiments, substrate 204 includes at least an insulator layer of a semiconductor-on-insulator (SOI) substrate (not specifically shown). Although not specifically shown, one skilled in the art understands that an SOI substrate includes a handle substrate, an insulator layer located on an upper surface of the handle substrate, and a semiconductor layer located on an uppermost surface of the insulator layer. The handle substrate provides mechanical support for the insulator layer and the semiconductor layer. The semiconductor layer of such an SOI substrate can be processed into semiconductor fins.

The handle substrate and the semiconductor layer of the SOI substrate can include the same, or different, semiconductor material. The term "semiconductor" as used herein in connection with the semiconductor material of the handle substrate and the semiconductor layer denotes any semiconductor material including, for example, Si, Ge, SiGe, SiC, SiGeC, II/VI, and III/V compound semiconductors such as, for example, InAs, GaAs, or InP. Multilayers of these semiconductor materials can also be used as the semiconductor material of the handle substrate and the semiconductor layer. In one or more embodiments, the handle substrate and the semiconductor layer are both formed of silicon. In some embodiments, the handle substrate can be a non-semiconductor material including, for example, a dielectric material and/or a conductive material. In yet other embodiments, the handle substrate can be omitted and the substrate 204 includes only an insulator layer.

In one or more embodiments, the handle substrate and the semiconductor layer can have the same or different crystal orientation. For example, the crystal orientation of the handle substrate and/or the semiconductor layer can be {100}, {110}, or {111}. Other crystallographic orientations besides those specifically mentioned can also be used in the present application. The handle substrate and/or the semiconductor layer of the SOI substrate can be a single crystalline semiconductor material, a polycrystalline material, or an amorphous material. Typically, at least the semiconductor layer is a single crystalline semiconductor material.

The insulator layer of the SOI substrate and that can be employed as substrate 204 can be a crystalline or non-crystalline oxide and/or nitride. In one or more embodiments, the insulator layer can bean oxide such as, for example, silicon dioxide. In some embodiments, the insulator layer can be a nitride such as, for example, silicon nitride or boron nitride. In yet other embodiments, the insulator layer can be a multilayered stack of, in any order, silicon dioxide and one of silicon nitride or boron nitride.

The SOI substrate can be formed utilizing standard processes including for example, SIMOX (Separation by IMplantation of OXygen) or layer transfer. When a layer transfer process is employed, an optional thinning step can follow the bonding of two semiconductor wafers together. The optional thinning step reduces the thickness of the semiconductor layer to a layer having a thickness that is more desirable.

By way of example, the thickness of the semiconductor layer of the SOI substrate can be from 10 nm to 100 nm. Other thicknesses that are lesser than, or greater than, the aforementioned thickness range can also be used as the thickness of the semiconductor layer of the SOI substrate. The insulator layer of the SOI substrate can have a thickness from 1 nm to 200 nm. Other thicknesses that are lesser than, or greater than, the aforementioned thickness range can also be employed as the insulator layer.

The first exemplary semiconductor structure shown in FIG. 2 can be formed by first providing a bulk semiconductor substrate (as defined above) or a SOI substrate (as defined above). Adjacent devices formed on the substrate can be separated by shallow trench isolation regions (not shown). The shallow trench isolation regions can be created early during the semiconductor device fabrication process, e.g., before the transistors such as the illustrated VFET are formed. The key steps for forming the shallow trench isolation regions typically involve etching a pattern of trenches in the substrate 204, depositing one or more dielectric materials (such as silicon dioxide) to fill the trenches, and removing the excess dielectric using a technique such as chemical-mechanical planarization.

The bottom epitaxy layer 202 can be formed by epitaxial growth and/or deposition. As used herein, the terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In one or more embodiments, the gas source for the deposition of epitaxial semiconductor material can include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. The particular epitaxial region is not intended to be limited and will generally depend on the type of VFET being formed.

The epitaxial deposition can be carried out in a chemical vapor deposition apparatus, such as a rapid thermal chemical vapor deposition (RTCVD) apparatus or a metal organic chemical vapor deposition (MOCVD) apparatus or a plasma enhanced chemical vapor deposition (PECVD) apparatus. The temperature for epitaxial deposition typically ranges from 500° C. to 900° C.

A vertically oriented semiconductor fin 206 can be formed on and coupled to the bottom epitaxy layer 202. Any known composition and manner of forming the semiconductor fin 206 can be utilized. In one or more embodiments, an undoped channel region can be epitaxially deposited over the bottom epitaxy layer 202 and can be etched using a patterned hard mask 208 to form a plurality of fins 206, as described below. The fins 206, one of which is shown, extends vertically from the substrate 204. Stated differently, the fin 206 is normal to or perpendicular to the substrate 204 including a portion having a shape of a rectangular parallelepiped.

The etching to form the fins 206 can include a dry etching process such as, for example, reactive ion etching, plasma etching, ion etching, or laser ablation. The etching can further include a wet chemical etching process in which one or more chemical etchants are used to remove portions of the blanket layers that are not protected by the patterned hardmask 208.

The direction along which a semiconductor fin 206 laterally extends the most is herein referred to as a "lengthwise direction" of the fin. The height of each semiconductor fin 206 can be in a range from about 5 nm to about 300 nm, although lesser and greater heights can also be employed. The width of each semiconductor fin 206 can be in a range from about 5 nm to about 100 nm, although lesser and greater widths can also be employed. In various embodiments, the fins 206 can have a width in the range of about 4 nm to about 20 nm, or can have a width in the range of about 5 nm to about 15 nm, or in the range of about 6 nm to about 8 nm. In various embodiments, the fin 206 can have a height in the range of about 25 nm to about 75 nm, or in the range of about 40 nm to about 50 nm. Alternatively, the bottom S/D can be formed after the formation of fins.

Multiple fins 206 can be arranged such that the multiple fins 206 have the same lengthwise direction, and are laterally spaced from each other along a horizontal direction that is perpendicular to the lengthwise direction. In this case, the horizontal direction that is perpendicular to the common lengthwise direction is referred to as a "widthwise direction." Each fin 206 includes a pair of parallel sidewalls along the lengthwise direction.

The fin width and the fin pitch can vary in different areas of a fin array, and can vary from one fin array to another on a semiconductor wafer, according to the design parameters of the integrated circuit that is being made. For example, fins of negatively doped FinFETs can have a different fin size than positively doped FinFETs because of the electrical properties of the materials.

The hardmask 208 can include, for example, a silicon nitride (SiN) hardmask. The hardmask 208 can be deposited using a deposition process, including, but not limited to, PVD, CVD, PECVD, or any combination thereof. Other hard mask compositions can include silicon oxides, silicon oxynitrides, silicon carbides, silicon carbonitrides, etc. Spin-on dielectrics can also be utilized as a hard mask material including, but not limited to, silsequioxanes, siloxanes, and boron phosphate silicate glass (BPSG) or the like. The hardmask can have a single material or multiple materials.

A bottom spacer layer 210 can be directionally deposited onto the bottom epitaxy layer 202 between the vertically oriented fin structures. The bottom spacer layer can be deposited by any non-conformal deposition methods that provides a faster deposition rate on the planar surface and slower deposition rate on the sidewall surface including but not limited to plasma vapor deposition (PVD), high density plasma (HDP) deposition or the like. After directional deposition of bottom spacer, an etch-back process is performed to remove the any residue of spacer materials from the fin sidewall. In PVD, a pure source material is gasified via evaporation, the application of high power electricity, laser ablation, or the like. The gasified material will then condense on the substrate material to create the desired layer. In one or more embodiments, the bottom spacer 210 can be a low k dielectric material. The term "low k dielectric" generally refers to an insulating material having a dielectric constant less than silicon nitride, i.e., less than 7.0. Exemplary low k dielectric materials include, but are not limited to, dielectric nitrides (e.g., silicon nitride, SiBCN), dielectric oxynitrides (e.g., SiOCN), or any combination thereof or the like.

In some exemplary embodiments, the bottom spacer layer 210 can include a material that is resistant to some etching processes such as, for example, HF chemical etching or chemical oxide removal etching. In one or more embodiments, the bottom spacer layer 210 can have a thickness in the range of about 3 nm to about 10 nm, or in the range of about 4 nm to about 6 nm.

A dummy gate 212 can be formed adjacent to the fins 206 on the bottom spacer layer 210 and over the shallow trench isolation regions (not shown). The dummy gate material 212 can be, for example, amorphous silicon layer or polysilicon. The dummy gate material can be formed by deposition of the desired silicon material, planarization using a suitable process such as, for example, chemical mechanical polishing (CMP), gate lithography, and reactive ion etching (ME) to define the dummy gate. The dummy gate can be recessed to expose an upper portion of the fin 206. Dummy gate can have a single material (e.g. amorphous carbon) or multiple materials (e.g., a dummy oxide liner between dummy amorphous silicon gate and fins).

A top spacer layer 214 can be deposited in the recess of the dummy gate 212. In one or more embodiments, the top spacer layer can be a conformal nitride liner, e.g., SiN, of the interlayer dielectric 216, which can be deposited thereon as shown. In this manner, the nitride liner covers sidewalls of the exposed top portion of the fin 206, as well as sidewalls/top surface (not shown) of the hard mask 208. The conformal SiN liner can also cover the exposed portions/sections of the interlayer dielectric (not shown).

A chemical-mechanical planarization selective to the hard mask 208 can be used to remove any excess portion of the interlevel dielectric (ILD) known as overburden). Any known composition and manner of forming the ILD 216 can be utilized. By way of example, the ILD can include any dielectric material including inorganic dielectrics or organic dielectrics. Some examples of suitable dielectrics that can be used as the dielectric material include, but are not limited to: silicon oxide, silsequioxanes, carbon doped oxides (i.e., organosilicates) that include atoms of Si, C, 0 and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The ILD can be deposited by spin on processes, PECVD processes or the like as is generally known in the art.

Figure 3:
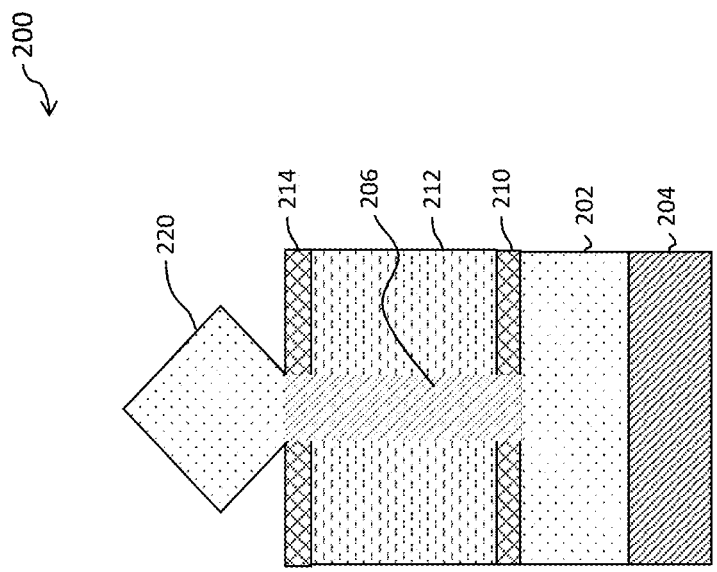

FIG. 3 is a cross-sectional view of the semiconductor device of FIG. 2, where the hardmask 208 and interlayer dielectric 216 positioned over the fins 206 can be etched away to the top nitride spacer layer 214, by either wet or dry etch processes in accordance with one or more embodiments of the present invention.

In various embodiments, etching takes place to remove the hard mask 208, as well portions/sections as the SiN mask 214, if present, contacting or engaging the hard mark 208. The removal of the hard mask 208 allows for the exposure of the top surface of the fin 206.

In one or more embodiments, a multi-faceted top S/D 220 can be epitaxially grown in the VFET structure. The multi-faceted top S/D can be epitaxially grown onto the exposed portion of the fin 206 using a selective epitaxial growth process. In various embodiments, the top S/D 220 can be n-doped or p-doped. It should be noted that the source and drain can be interchangeable between the top and bottom locations of the vertical fin 206, where the doped region in the substrate can act as a source or a drain.

The epitaxial semiconductor material that provides the S/D regions 202 or 220 can be in situ doped to a p-type conductivity or an n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material can introduce p-type dopants to the material being formed during the epitaxial deposition process that includes p-type source gasses. For nFET devices, Si:P (phosphorus-doped silicon) can be used as the doping layer whereas for pFET devices, SiGe:B (boron-doped silicon germanium) can be used as the doping layer.

Epitaxial materials can be grown from gaseous or liquid precursors. Epitaxial materials can be grown using vapor-phase epitaxy (VPE), molecular-beam epitaxy (MBE), liquid-phase epitaxy (LPE), rapid thermal chemical vapor deposition (RTCVD), metalorganic chemical vapor deposition (MOCVD), ultrahigh vacuum chemical vapor deposition (UHVCVD), low-pressure chemical vapor deposition (LPCVD), limited reaction processing CVD (LRPCVD), or other suitable process. Epitaxial silicon, silicon germanium (SiGe), germanium (Ge), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the S/D can range from about $1 \times 10^{19}$ cm$^{-3}$ to about $3 \times 10^{21}$ cm$^{-3}$, or in one or more other embodiments, can be in a range from about $2 \times 10^{20}$ cm$^{-3}$ and about $3 \times 10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

The Si:C layer can be grown in the same chamber used for other epitaxy steps or in a dedicated Si:C epitaxy chamber. Greater carbon content or a thicker Si:C layer can slow phosphorus and boron diffusion, so the carbon content and thickness can be tailored as needed. The Si:C layer can be in the range of 1 nm to 10 nm thick and can include carbon in the range of 0.2 to 3.0%. In one or more embodiments, the Si:C layer can be quite thin such as in the range of less than 5 nm, or between 1 and 5 nm thick, e.g., 3 nm thick, and can have between 2 and 2.5% carbon. The Si:C layer can be formed by traditional epitaxial processing, or a cyclical process.

One such cyclical process includes a first epitaxial deposition. On exposed semiconductor surfaces, the growth will be single crystalline. Elsewhere, the growth will be amorphous. An etch using only an etchant gas such as chlorine or HCl or Cl2 can be used to attack and remove the amorphous material. This etch can be timed to leave some crystalline material while removing all the amorphous material. Repeating this sequence can build up a desired thickness of crystalline material.

According to one or more embodiments, after a sufficient thickness of Si:C is formed, the conditions in the chamber can be adjusted to fill the pFET source drain with material such as boron doped silicon germanium that promotes hole mobility. For example if the fin material is silicon, a preferred pFET source drain material can be silicon germanium having germanium content in the range of 5% to 80%, or preferably between 20% and 60%. The optimal germanium content of the SiGe source drain can be selected based on design preferences and in embodiments can be about 40%. In preferred embodiments, the source drain filling step can utilize epitaxial growth conditions that promote in-situ boron doped formation of SiGe to merge the source drain regions in the pFET regions. The conditions can be tuned to incorporate in the SiGe a boron content in the range of about $1\times10^{19}$ cm$^{-3}$ to about $2\times10^{21}$ cm$^{-3}$, or in one or more other embodiments, can be in a range from about $2\times10^{20}$ cm$^{-3}$ and about $7\times10^{20}$ cm$^{-3}$.

By way of example, a phosphorous doped silicon layer can utilize silicon containing precursors such as DCS, SiH$_4$, Si$_2$H$_6$, Si$_3$H$_8$, Si$_4$H$_{10}$ and the like for silicon growth. For phosphorous doping, PH$_3$ can be used as the gas source. The low temperature deposition is generally non-selective and can be used to form a phosphorous doped semi-crystalline (i.e., polysilicon) and/or a phosphorous doped non-crystalline amorphous silicon (referred to herein as "poly/amorphous silicon") on the dielectric surfaces, e.g., 214, and a phosphorous doped single crystalline silicon on the exposed surfaces of the channel region of the fin structure 206. Because of the growth rate difference in different crystal orientations, a multifaceted top S/D region of the single crystalline silicon on the fin structure 206 can be formed, which is depicted as diamond shaped. The poly/amorphous silicon can be selectively removed from the substrate using an etching process.

Figure 4:
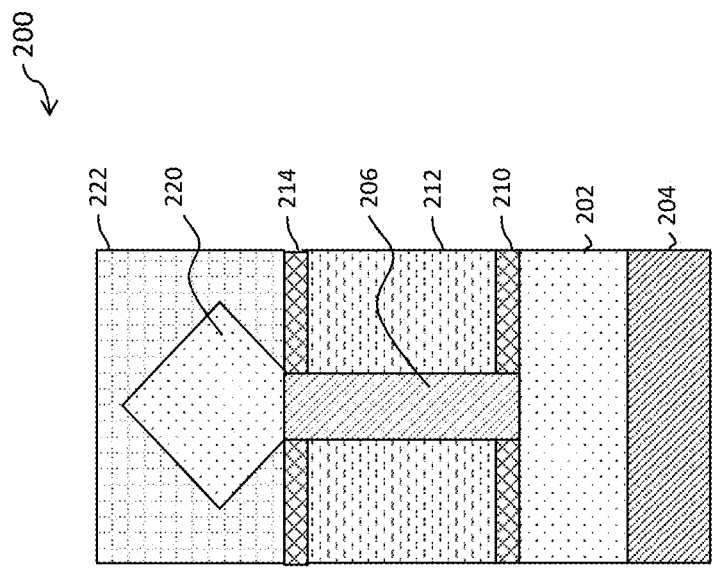

In FIG. 4, an oxide deposition process can be used for form an oxide fill 222 about the top S/D 220. In one or more embodiments, the oxide deposition process can be a flowable oxide deposition process or HDP oxide deposition process. In some embodiments, the nitride top spacer protects other device structures such as fins, dummy gate, from undesired oxidation.

The oxide deposition can convert the surface of the source drain 220 into an oxide. The low temperature oxide deposition process can be performed at a temperature of about 700° C., or less. More typically, the low temperature oxide deposition process can be performed within a range of about 400° C. to about 700° C. A thin nitride liner deposition prior to the oxide deposition can be used to protect the surface of the S/D 220.

Figure 5:
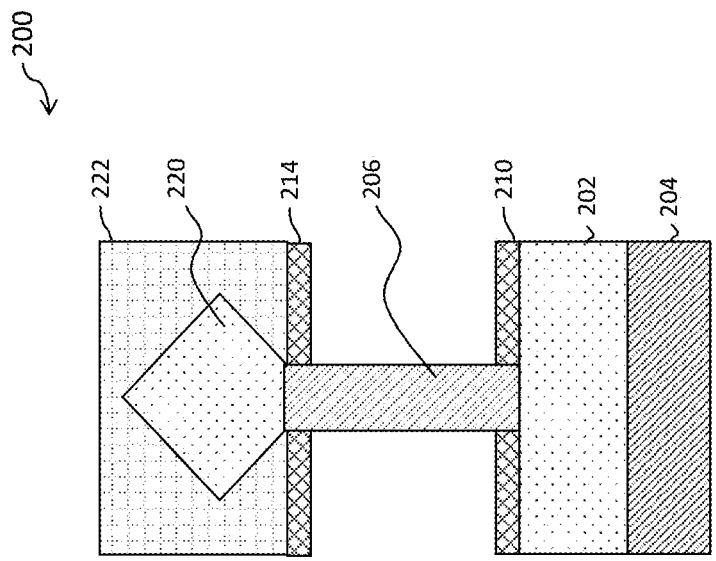

In FIG. 5, the recessed dummy gate can be removed according to a replacement metal gate (RMG) process as understood by those ordinarily skilled in the art. For example, the dummy gate 212 can be removed using an RIE process and/or a wet etching process. According to at least one or more embodiments, an anneal process can be performed after removing the dummy gate to activate the dopants of the S/D regions. For example, the anneal process can generate a temperature of approximately 900 degrees Celsius (C) or higher. The anneal can be a rapid thermal anneal (RTA), laser anneal, flash anneal, or any suitable combination of those processes.

Figure 6:
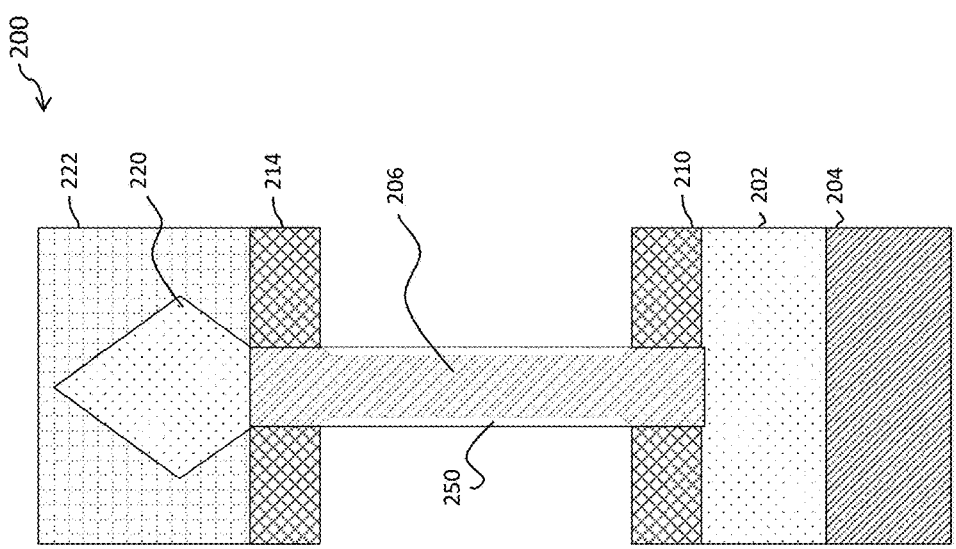

In FIG. 6, a first etching process can be performed on or more portions of the fins 206 to remove/trim material from the fins 206. The removal/trimming of the fins 206 can form recesses 250 in the fins 206. The first etching process can employ an anisotropic etch. Anisotropic etching is a fabrication technique that removes material in specific directions allowing for the production of geometric characteristics such as sharp corners, flat surfaces, and deep cavities. An exemplary anisotropic etch which can be used to form recesses 250 is a tetramethyl ammonium hydroxide (TMAH) wet etch.

Figure 7:
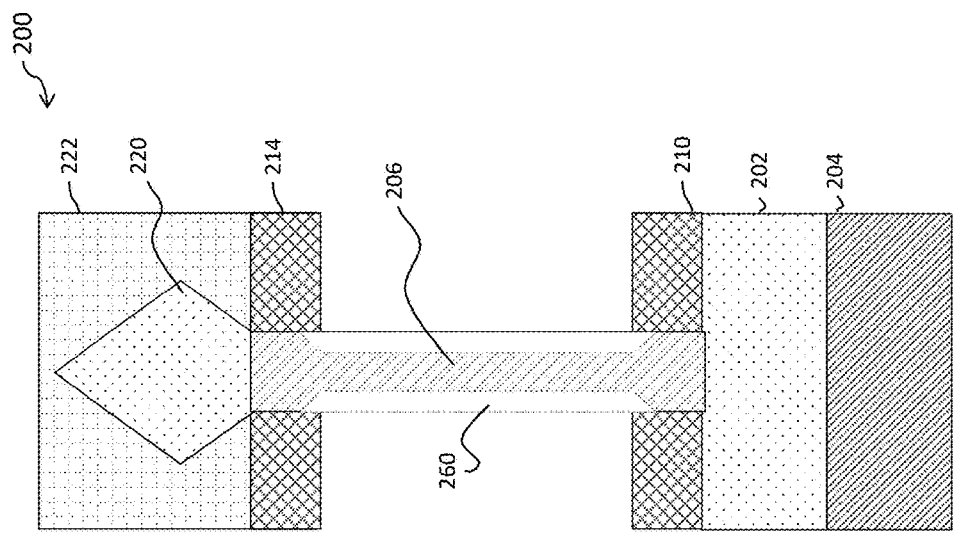

In FIG. 7, a second etching process can be performed on or more portions of the fins 206 to further remove/trim material from the fins 206. The removal/trimming of the fins 206 can increase a size of recesses 250 to form recesses 260. The recess 260 can extend into the top spacer 214 and bottom spacer 210. The second etching process can employ an isotropic etch. Isotropic etching is a fabrication technique that removes material in all directions. Any suitable isotropic etching technique can be employed to form recesses 260.

Figure 8:
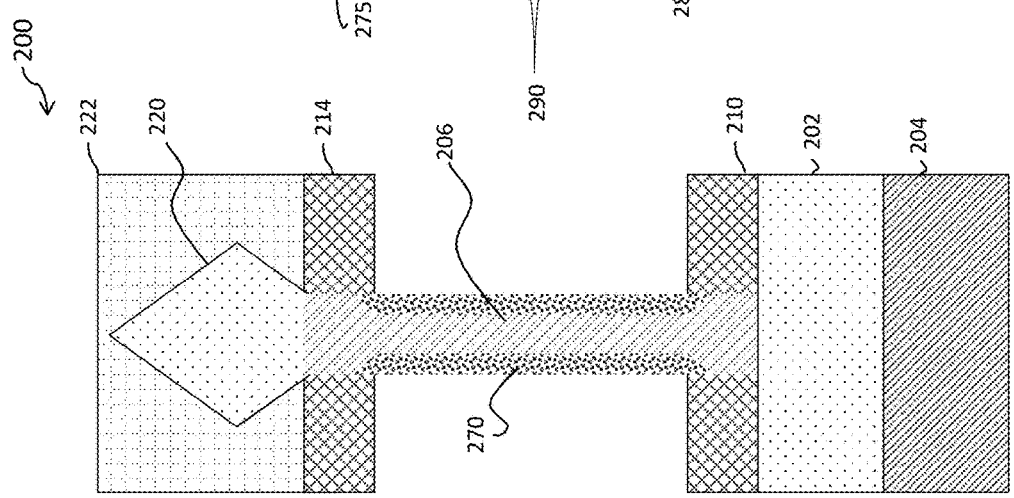

In FIG. 8, a strain layer 270 can be epitaxially grown on one or more recesses 260 of the fin 206 in order to form a strained channel that includes the fin 206 and the strain layer 270. For example, the strain layer 270 can be silicon germanium (SiGe). Epitaxial techniques to grow strain layer 270 can include, for example, rapid thermal chemical vapor deposition (RTCVD), molecular beam epitaxy (MBE) and ultrahigh vacuum chemical vapor deposition (UHV/CVD).

Figure 9:
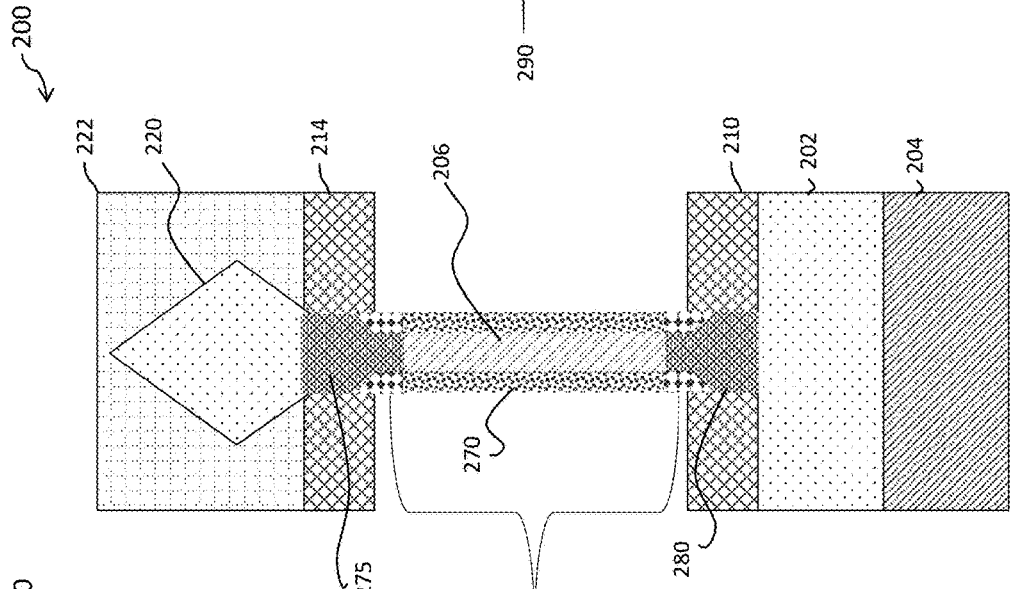

In FIG. 9, extension regions 275 and 280 can be formed by, for example, an annealing process or diffusion process that drives dopants from the top S/D 220 and from the bottom S/D formed in the substrate 204 into the extension regions 275 and 280, respectively. The annealing process or diffusion process can also drive dopants from the top S/D 220 and from the bottom S/D formed in the substrate 204 into a portion 290 of the strain layer 270. Accordingly, defects related to boundary areas 195 of a typical SiGe channel (e.g., FIG. 1) are mitigated because the defects associated with VFET structure 200 can reside in the extension region 275 or 280, respectively, instead of portions of the fin that are utilized as channel regions for the VFET structure 200. Accordingly, performance associated with VFET devices using VFET structure 200 can be improved.

Figure 10:
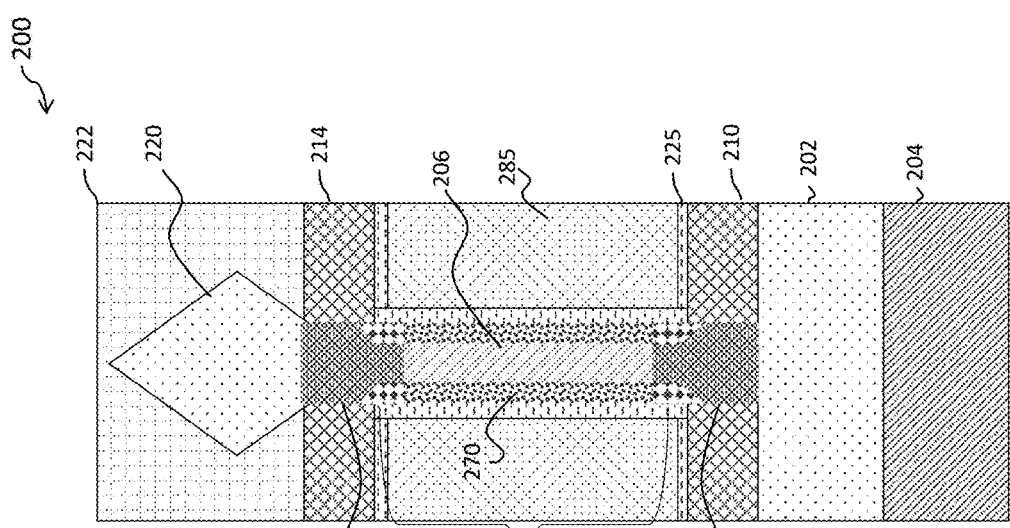

Referring to FIG. 10, a high-dielectric constant (high-k) layer can be deposited as a gate dielectric 225 and followed by the formation of a metal gate 285. Gate dielectric 225 can include any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k can further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from 1 nm to 5 nm, although less thickness and greater thickness are also conceived.

Metal gate 285 can include any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti3A_1$, ZrAl), TaC, TaMgC, carbon nanotube, conductive carbon, graphene, or any suitable combination of these materials. The conductive material can further include dopants that are incorporated during or after deposition. In some embodiments, the gate can further include a work function setting layer between the gate dielectric and gate conductor. The work function setting layer can be a work function metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

Accordingly, embodiments described herein provide methods and structures for forming a VFET having a strained silicon germanium (SiGe) channel region that is epitaxially grown on anchored silicon (Si) fin to preserve strain in the SiGe channel region. Portions of the Si fin can be recessed/trimmed. The recessed portions can stretch into an extension region prior to SiGe epitaxial growth. SiGe in the recessed portions can be doped to form the extension region by employing a dopant drive-in from a source/drain. Any potential SiGe epitaxial defects can therefore be confined to the extension region instead of the SiGe channel region thereby avoiding semiconductor device issues caused by having defects within the SiGe channel region.

Various embodiments of the present invention are described herein with reference to the related drawings. Alternative embodiments of the present invention can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the embodiments of the present invention are not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of one or more embodiments of the present invention are unique. Thus, the unique combination of the operations described in connection with the fabrication of a semiconductor device according to one or more embodiments of the present invention can utilize a variety of individually known physical and chemical processes performed on a semiconductor (e.g., silicon) substrate, some of which are described in the immediately following paragraphs.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a fin structure for a semiconductor device, the method comprising:
    forming a fin;
    recessing a first portion of the fin to form a recess in the fin;
    forming a channel region in the first portion of the fin;
    forming an extension region on a second portion of the fin;
    wherein the recess extends into the extension region;
    wherein defects are collected within the extension region from the channel region in the first portion of the fin;
    wherein an interface associated with the channel region, the fin and a spacer is free of defects.

2. The method of claim 1, strained silicon germanium is epitaxially grown in the recess.

3. The method of claim 1, further comprising forming a source/drain on the second portion of the fin.

4. The method of claim 3, wherein the source/drain is epitaxially grown on the second portion of the fin.

5. The method of claim 4, wherein dopants associated with the source/drain is used to form the extension region.

6. The method of claim 5, wherein an annealing process is used to drive dopants from the source/drain into the extension region.

7. The method of claim 1, the recess is formed using first etch to remove a first portion of the fin and a second etch to remove a second portion of the fin.

8. A method for forming a semiconductor device, the method comprising:
    forming a first source/drain on a semiconductor substrate;
    forming a first spacer on the first source/drain;
    forming a fin on a portion of the first spacer;
    recessing a first portion of the fin to form a recess in the fin;
    forming a channel region in the first portion of the fin; and
    forming a first extension region on a second portion of the fin;
    wherein the recess extends into the first extension region on the second portion of the fin;
    wherein defects are collected within the extension regions from the channel region in the first portion of the fin;
    wherein an interface associated with the channel region, the fin and the first spacer is free of defects.

9. The method of claim 8 further comprising:
    forming a second spacer on a third portion of the fin;
    forming a second source/drain on the second spacer and the third portion of the fin; and
    forming a second extension region on the third portion of the fin.

10. The method of claim 9, wherein dopants associated with the first source/drain are used to form the extension region on the second portion of the fin and dopants associated with the first source/drain are used to form the extension region on the third portion of the fin.

11. The method of claim 8, wherein an interface associated with the channel region, the fin and the second spacer is substantially free of defects.

12. The method of claim 8, wherein the recess extends into the second extension region on the third portion of the fin.

13. The method of claim 8, wherein strained silicon germanium is epitaxially grown in the recess.

14. The method of claim 8, wherein the recess is formed using a first etch to remove a first portion of the fin and a second etch to remove a second portion of the fin.

* * * * *